United States Patent [19]

Karulkar

[11] Patent Number: 4,507,852
[45] Date of Patent: Apr. 2, 1985

[54] METHOD FOR MAKING A RELIABLE OHMIC CONTACT BETWEEN TWO LAYERS OF INTEGRATED CIRCUIT METALLIZATIONS

[75] Inventor: Pramod C. Karulkar, Diamond Bar, Calif.

[73] Assignee: Rockwell International Corporation, El Segundo, Calif.

[21] Appl. No.: 531,529

[22] Filed: Sep. 12, 1983

[51] Int. Cl.³ .............................................. H01L 21/90
[52] U.S. Cl. ......................................... 29/590; 29/591; 357/67; 357/71
[58] Field of Search .............. 29/589, 590, 591, 577 C; 357/67 S, 71

[56] References Cited

U.S. PATENT DOCUMENTS

| | | | |
|---|---|---|---|
| 3,777,364 | 12/1973 | Schinella et al. .................. | 29/590 X |
| 4,102,733 | 7/1978 | De La Moneda et al. ....... | 29/571 X |
| 4,164,461 | 8/1979 | Schilling ....................... | 204/192 EC |
| 4,228,212 | 10/1980 | Brown et al. ..................... | 427/91 X |

Primary Examiner—Brian E. Hearn
Assistant Examiner—Alan E. Schiavelli
Attorney, Agent, or Firm—H. Fredrick Hamann; Daniel R. McGlynn

[57] ABSTRACT

A method of fabricating a semiconductor integrated circuit by providing a semiconductor body having a major surface; depositing a first layer of a conductive material on the major surface of the semiconductor body, and depositing a layer of a refractory silicide on the first layer of conductive material. Portions of said refractory silicide layer are marked to define a first pattern thereon; and the silicide layer is etched down to the first conductive layer in order to produce the pattern defined by the masking step. Portions of the body are masked again to define a second pattern thereon; etching said first conductive layer in said second masking pattern. The semiconductor body is sintered to stabilize the contact between first conductive layer and layer of refractory silicide. A layer of dielectric material is deposited on body. Portions of said dielectric material are masked to define a third pattern thereon; and the dielectric material is etched to silicide layer in accordance with the third pattern. A second layer of conductive material is deposited on body; and the body is sintered again in order to stabilize the contact between the second conductive layer and the silicide layer.

2 Claims, 5 Drawing Figures

METHOD FOR MAKING A RELIABLE OHMIC CONTACT BETWEEN TWO LAYERS OF INTEGRATED CIRCUIT METALLIZATIONS

BACKGROUND OF THE INVENTION

1. Field of the Invention

This invention relates to semiconductor device fabrication, and in particular a method of forming two levels of metal interconnection.

2. Description of the Prior Art

The prior state of the art of forming metal interconnections in integrated circuits is reviewed in, for example, "Metalization for Very Large Scale Integrated Circuits" by P. B. Ghate, on pages 359–383 in Thin Solid Films, Volume 93, 1982. In summary, the circuit consists of a semiconductor body in which active and passive devices such as transistors, diodes, and resistors are fabricated. These devices are interconnected by narrow lines of a thin metal layer. For cost savings and for improved performance, the size of the circuit chip is reduced by using two levels of metal interconnections. The first layer is usually aluminum, which has very high conductivity and can be deposited very easily. The interlevel insulator is usually silicon dioxide, silicon nitride, or polyimide. The contact apertures in the insulator are opened by photolithography and wet etching or plasma etching. The second level metal is mostly aluminum, but titanium-aluminum, titanium-gold, etc., double layers have been used. The second level metal is also patterned by standard techniques. Although there are several aspects affecting the reliability of the contacts between the two levels of the metal, one major problem has been the presence of an unwanted layer of an insulating residue on the surface of the first level metal at the bottom of the aperture. This residue layer is believed to contain mostly aluminum oxide, aluminum hydroxide, or hydrocarbons and fluorocarbons left from a plasma etch process. The removal of this layer by wet etching or sputter etching has been the subject of several investigations and inventions. (See, for example, Nasa Tech Brief #MFS-25149; J. Electronic Materials, Vol. 11, No. 3, p.441, 1981; J. Electrochemical Society, Vol. 125, No.3, p.467, 1978; J. Vacuum Science and Technology, Vol. 20, No.3, p.396, 1982; U.S. Pat. No. 4,184,933; U.S. Pat. No. 4,164,461). The use of wet etching for the cleaning of the contact apertures has been found to be disadvantageous because it attacks lower aluminum and wet rinses finally leave an oxide layer on aluminum. Sputter etching, which is extensively used in experimentation, results in radiation damage and is unsuitable for certain types of circuits. Prior to the present invention, there has not been a high yield reliable process for making good ohmic contact between the lower level aluminum layer and an upper level metal layer through a contact aperture.

SUMMARY OF THE INVENTION

Briefly, and in general terms, the present invention provides a method of fabricating a semiconductor integrated circuit by providing a semiconductor body having a major surface; depositing a first layer of a conductive material on the major surface of the semiconductor body, and depositing a layer of a refractory silicide on the first layer of conductive material. Portions of said refractory silicide layer are marked to define a first pattern thereon; and the silicide layer is etched down to the first conductive layer in order to produce the pattern defined by the masking step. Portions of the body are masked again to define a second pattern thereon; etching said first conductive layer in said second masking pattern. The semiconductor body is sintered to stabilize the contact between first conductive layer and layer of refractory silicide. A layer of dielectric material is deposited on body. Portions of said dielectric material are masked to define a third pattern thereon; and the dielectric material is etched to silicide layer in accordance with the third pattern. A second layer of conductive material is deposited on body; and the body is sintered again in order to stabilize the contact between the second conductive layer and the silicide layer.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

DESCRIPTION OF THE PREFERRED EMBODIMENTS

Figure 1:
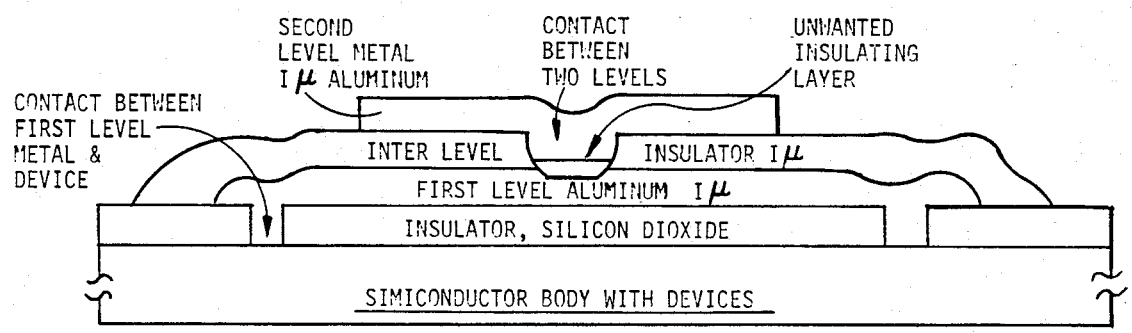
FIG. 1 shows a cross sectional view of a portion of a semiconductor body which incorporates a two level interconnect known in the prior art.

FIG. 1 shows a cross sectional view of a portion of a semiconductor body which incorporates a two level interconnect known in the prior art. The unwanted layer of an insulator formed in the contact aperture is explicitly shown. The present invention prevents the contamination of the surface of the first level metal by using a protective overcoat of a refractory conducting material and by making possible the cleaning of the surface in the contact aperture without the problems related to the corrosion of the material therein. Such a technique makes improved contact yields possible. A semiconductor wafer is processed through the fabrication of all the active and passive devices of the integrated circuit. A layer of an insulator is deposited. Apertures are opened in the selected area to make contacts with the devices. The first level of the metal, which is to be used as the interconnect, is deposited all over the wafer. This is followed by a protective layer consisting of a refractory metal silicide. The silicide layer and the first level metal are patterned either by using a single photomask or by using different photomasks. The silicide is patterned such that it completely covers the areas which are going to lie under the contact apertures opened in the next insulator layer. The metalizations are sintered and a layer of interlevel insulator is applied. Contact apertures are opened in this insulator by photolithography and etch. Just prior to the deposition of the second level metal, the semiconductor wafer is cleaned in a hydrofluoric acid containing solution. The second level metal is deposited and patterned. The wafer is sintered. The completed structure is illustrated in FIG. 2.

In the preferred embodiment of the invention, the lower interconnect metal is aluminum or its alloy and the upper interconnect metal is either aluminum, its alloy, or a refractory metal coated with gold. The intermediate layer of refractory silicide is of titanium silicide, molybdenium silicide, tantalum silicide or tungsten silicide. The lower level aluminum and the silicide can be deposited in one pump down in a single vacuum system but such a requirement is not necessary for the success of this process. The sintering is done in hydrogen atmosphere at 480° C. or less depending on the stability of the second level metalization. The interlevel insulator is deposited silicon dioxide.

Figure 2A:
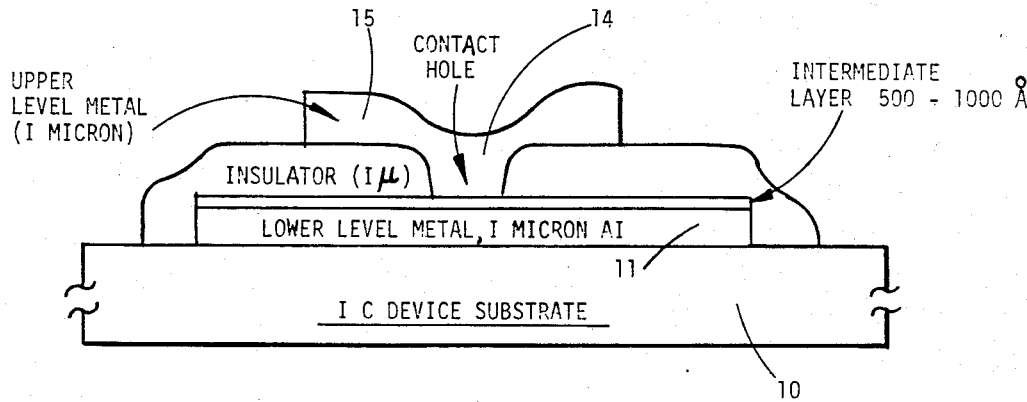
FIG. 2(a) shows a cross sectional view of a portion of a semiconductor body which was formed according to a first embodiment of the method according to the present invention.

Turning more specifically to the drawing,

FIG. 2(a) shows a cross sectional view of a portion of a semiconductor body which was formed according to a first embodiment of the method according to the present invention; the intermediate layer of the refractory silicide and the lower level aluminium are patterned using a single mask. Thus lower aluminium is completely covered by the silicide.

Figure 2B:
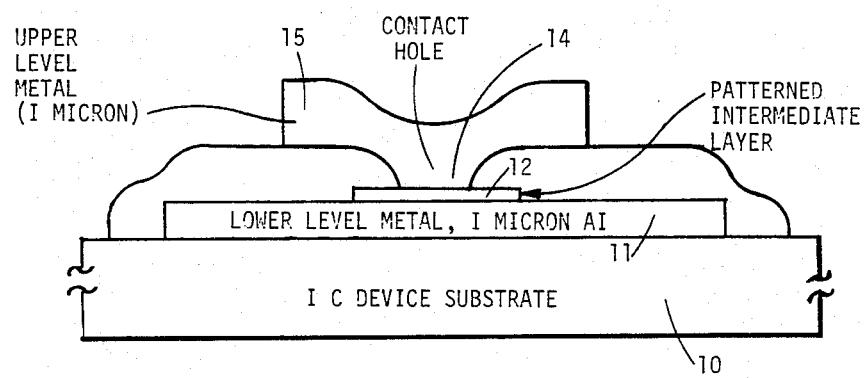
FIG. 2(b) shows a cross sectional view of a portion of a semiconductor body which was formed according to a second embodiment of the method according to the present invention.

FIG. 2(b) shows a cross sectional view of a portion of a semiconductor body which was formed according to a second embodiment of the method according to the present invention; the intermediate layer of the silicide and the lower level aluminium are patterned by using different mask. Thus the silicide covers lower aluminium only under the interlevel apertures.

Figure 2C:
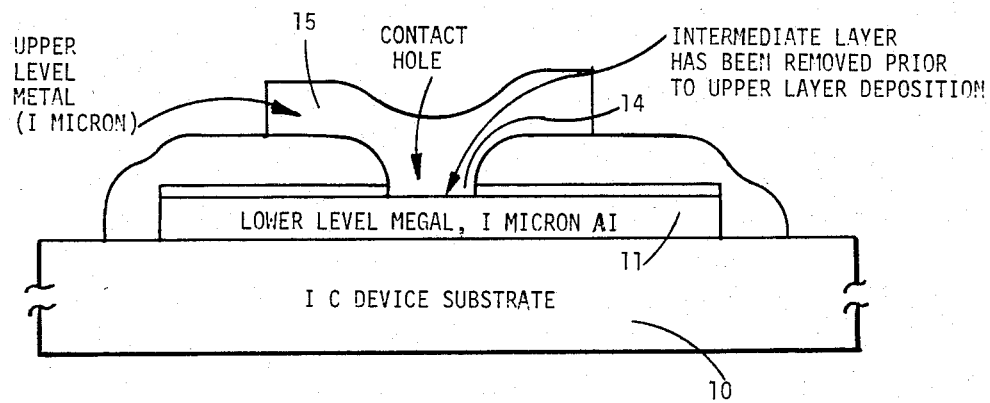
FIG. 2(c) shows a cross sectional view of a portion of a semiconductor body which was formed according to a third embodiment of the method according to the present invention.

FIG. 2(c) shows a cross sectional view of a portion of a semiconductor body which was formed according to a third embodiment of the method according to the present invention; the silicide layer is etched completely or partly inside the contact hole. This is done just prior to the deposition of the second level metal interconnect.

Figure 3:
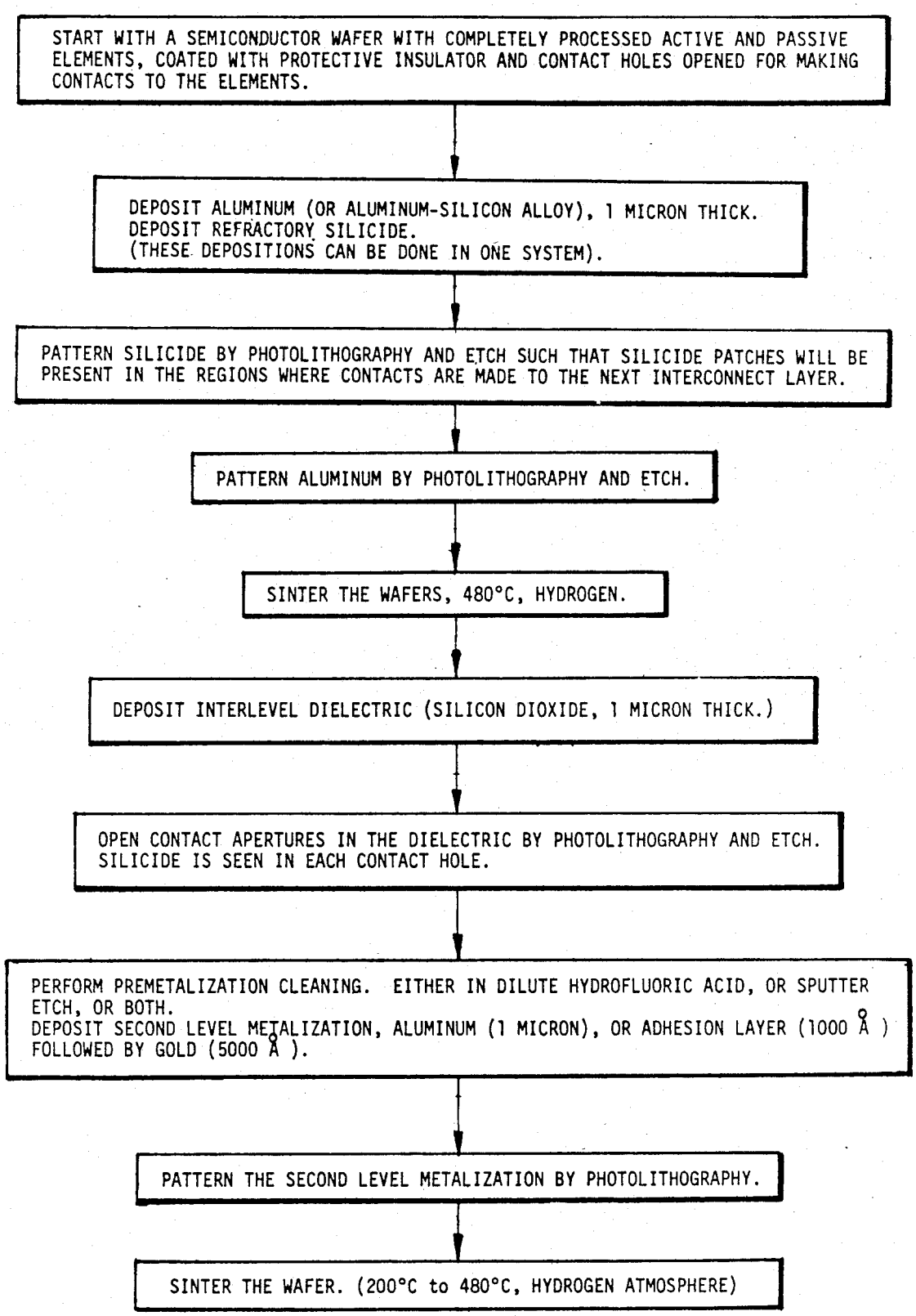
FIG. 3 shows a flow chart of the process sequence according to the present invention.

FIG. 3 shows a flow chart of the process sequence according to the present invention.

A method of forming two levels of metal interconnect for the fabrication of a semiconductor integrated circuit according to the present invention is now described. The method here starts with a semiconductor wafer 10 on which a large number of active and passive devices such as transistors, diodes, resistors are to be fabricated and the whole wafer 10 is coated with an insulator. A two level metal interconnect (not shown for simplicity, but assumed to be included in 10 in FIGS. 1a, 2b, and 2c) is intended to be applied to this wafer. Small apertures are opened in the insulator at selected points (not shown) for the first level metal interconnect to make contacts with the devices underneath. The Figures utilize the simplified depiction IC Device substrate 10 to represent such configurations. Then the first level metal 11 which is usually aluminum is deposited. It is then followed by the deposition of a layer 12 of refractory metal silicide. The silicide layer 12 and the aluminum layer 11 are patterned by photolithography and etch. The etching step utilizes a buffered hydrofluoric acid which is applied to the exposed layer. A sintering step follows. Then a layer 13 of insulator, usually a chemical vapor deposited layer of silicon dioxide, is applied. Small apertures 14 are opened in the insulator at selected locations. The silicide pattern obtained earlier is such that only the silicide is exposed when apertures are opened and all the aluminum interconnects are well protected by either the silicide or oxide insulator. A layer 15 of the second level metal is applied after cleaning the wafer (wet process or plasma process). The second level layer 15 is then patterned and optionally sintered. The second level metal layer 15 can be aluminum, a refractory metal, or a refractory metal with gold overcoat. This technique maintains the advantage of the low resistivity of aluminum and adds on the reliability of the interlevel contact offered by the silicide layer 12. The problem of the formation of an unwanted complex insulator layer on lower aluminum in the contact apertures 14 is avoided. Since silicides are resistant to chemical attack, just before the deposition of the second level metal, aggressive wet etches can be used to clean the interlevel apertures. RF sputter etching, which is sometimes undesired, is not required. The presence of the silicide in the contact aperture offers a barrier for migration of metal between levels (e.g. electromigration and diffusion)—and it suppresses hillock formation to some extent if present all over the lower aluminum metal. The scheme described here is such that the second level metal, if it is aluminum or a refractory metal with or without gold overcoat, can be reworked in the case of a processing problem.

It will be obvious to those skilled in the art that the semiconductor process according to the present invention can be implemented with various semiconductor technologies and different combinations of known process steps, and that the preferred embodiments illustrated here are merely exemplary. The thickness of the layers, depth of penetration of the various zones and regions, the interlayer dielectric layer material, and in particular the configuration and distance between the various layers and zones, as well as the the types of solid state devices to which the metallization is applied can be chosen depending upon the desired properties. These and other variations can be further elaborated by those skilled in the art without departing from the scope of the present invention.

The present invention is also not restricted to the specific semiconductor materials and circuits described. For example, it may be pointed out that semiconductor materials other than silicon, for example $III_A-V_B$ compounds, may be used. Furthermore, the conductivity types in the embodiment may be interchanged and corresponding to such change, the polarity of the respective operating voltages adapted. Moreover, the voltage level and the static or dynamic nature of the signals applied to the various terminals and gates of the device, as well as the voltage sources, may be suitably selected as desired for a particular application.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. A method of fabricating a semiconductor integrated circuit comprising the steps of:
    providing a semiconductor body having a major surface;

depositing a first aluminum layer on said major surface of said semiconductor body;

depositing a layer of a refractory silicide selected from the group of silicides of tungsten, titanium, tantalum, and molybdenum on said first layer of conductive material;

masking portions of said refractory silicide layer to define a first pattern thereon;

etching said silicide layer down to said first aluminum layer in order to produce the pattern defined by said masking step;

masking portions of said body to define a second pattern thereon;

etching said first aluminum layer in said second masking pattern;

sintering the semiconductor body to stabilize the contact between said first aluminum layer and said layer of refractory silicide;

depositing a layer of dielectric material on said body;

masking portions of said dielectric material to define a third pattern thereon;

etching through said dielectric material to said silicide layer in accordance with the third pattern;

depositing a second aluminum layer on said body; and sintering said body in order to stabilize the contact between said second conductive layer and said silicide layer.

2. A method for fabricating a semiconductor integrated circuit comprising the steps of:

providing a semiconductor body having a major surface;

depositing a first aluminum layer on said major surface of said semiconductor body;

depositing a layer of a refractory silicide material on said first aluminum layer;

selectively removing portions of said layer of refractory silicide material to form a first pattern of refractory silicide material on said aluminum layer;

selectively removing portions of said aluminum layer to define a second pattern thereon;

sintering the semiconductor body in order to stabilize the contact between said first aluminum layer and said layer of refractory silicide materials;

depositing a layer of dielectric material on said first aluminum layer of material and said layer of refractory silicide material;

selectively removing portions of said dielectric material to form a third pattern thereon;

depositing a second aluminum layer on said layer of dielectric material and any exposed portions of said layers of said refractory silicide material and said first aluminum layer; and sintering said body in order to stabilize the contact between said second aluminum layer and said layer of refractory silicide material.

* * * * *